(12) United States Patent
Manning et al.

(10) Patent No.: US 7,265,016 B2
(45) Date of Patent: Sep. 4, 2007

(54) STEPPED GATE CONFIGURATION FOR NON-VOLATILE MEMORY

(75) Inventors: H. Montgomery Manning, Eagle, ID (US); Kunal Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 129 days.

(21) Appl. No.: 11/257,637

(22) Filed: Oct. 25, 2005

(65) Prior Publication Data

US 2006/0043467 A1    Mar. 2, 2006

Related U.S. Application Data

(62) Division of application No. 10/928,082, filed on Aug. 27, 2004.

(51) Int. Cl.
*H01L 21/336* (2006.01)
(52) U.S. Cl. ................... 438/257; 257/E29.309
(58) Field of Classification Search ........... 438/216, 438/257, 258, 264, 287, 594, 595, 201, 211; 257/320–321, 411
See application file for complete search history.

(56) References Cited

U.S. PATENT DOCUMENTS

| 5,930,634 A | 7/1999 | Hause et al. |
| 6,406,945 B1 | 6/2002 | Lee et al. |
| 6,706,599 B1 * | 3/2004 | Sadd et al. ............ 438/261 |
| 6,709,934 B2 | 3/2004 | Lee et al. |

* cited by examiner

*Primary Examiner*—David Vu
(74) *Attorney, Agent, or Firm*—Leffert Jay & Polglaze, P.A.

(57) ABSTRACT

A memory device having a field effect transistor with a stepped gate dielectric and a method of making the same are herein disclosed. The stepped gate dielectric is formed on a semiconductor substrate and consists of a pair of charge trapping dielectrics separated by a gate dielectric; a gate conductor is formed thereover. Source and drain areas are formed in the semiconductor substrate on opposing sides of the pair of charge trapping dielectrics. The memory device is made by forming a charge trapping dielectric layer on a semiconductor substrate. A trench is formed through the charge trapping dielectric layer to expose a portion of the semiconductor substrate. A gate dielectric layer is formed within the trench and a gate conductor layer is formed over the charge trapping and gate dielectric layers.

20 Claims, 6 Drawing Sheets

STEPPED GATE CONFIGURATION FOR NON-VOLATILE MEMORY

CROSS-REFERENCE TO RELATED APPLICATION

This is a divisional application of application Ser. No. 10/928,082, titled "STEPPED GATE CONFIGURATION FOR NON-VOLATILE MEMORY," filed Aug. 27, 2004 (pending), which application is assigned to the assignee of the present invention and the entire contents of which are incorporated herein by reference.

TECHNICAL FIELD OF THE INVENTION

The present invention relates generally to memory devices and in particular, the present invention relates to field effect transistors having a stepped gate dielectric.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory. One type of flash memory is a nitride read only memory (NROM). NROM has some of the characteristics of flash memory but does not require the special fabrication processes of flash memory. NROM integrated circuits can be implemented using a standard CMOS process.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

As the size of memory devices shrinks, so too does the charge trapping capacity of those devices. And, as the charge trapping capacity shrinks, so does the threshold voltage difference that differentiates the programmed states of the device. Because variations in the operational characteristics of these ever-shrinking memory devices can have serious effects on the ability of the memory devices to perform reliably, it is important to enhance the charge trapping ability of these memory devices. In this way, the effect of variations in the operational characteristics of a memory device can be more easily accommodated and it will be possible to more reliably discriminate between the programmed states of the device. Accordingly, there is a need for an improved memory device having an enhanced charge trapping ability.

BRIEF SUMMARY OF THE INVENTION

A memory device of the present invention may be realized in the provision of a field effect transistor that has a stepped gate dielectric. One embodiment of the present invention has a gate dielectric layer that is disposed between two charge trapping layers on a semiconductor substrate. The gate dielectric layer is generally thinner than the charge trapping layers that border it. A control gate overlies the gate dielectric and charge trapping layers.

One embodiment of the memory device of the present invention may be made by first forming a charge trapping dielectric layer on a semiconductor substrate. A trench is formed in the charge trapping dielectric layer and a gate dielectric is formed therein. A gate conductor is then formed to overlie the charge trapping dielectric layer and the gate dielectric. The charge trapping layer is then trimmed back to the edge of the gate conductor.

The invention further provides methods and apparatus of varying scope.

DETAILED DESCRIPTION

Figure 1:
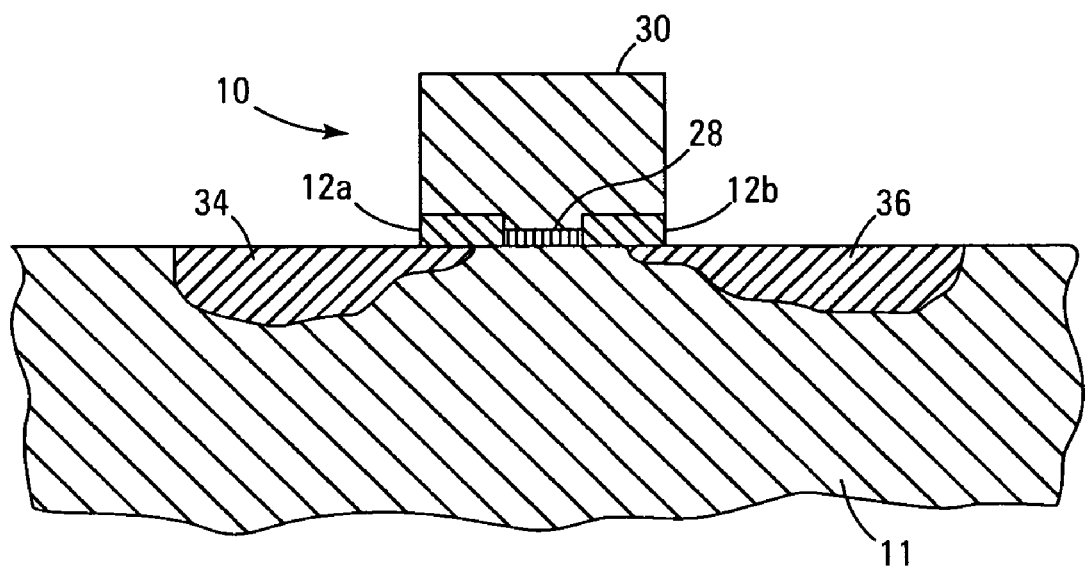
FIG. 1 is a cross-sectional view of a portion of a memory device.
Figure 2:
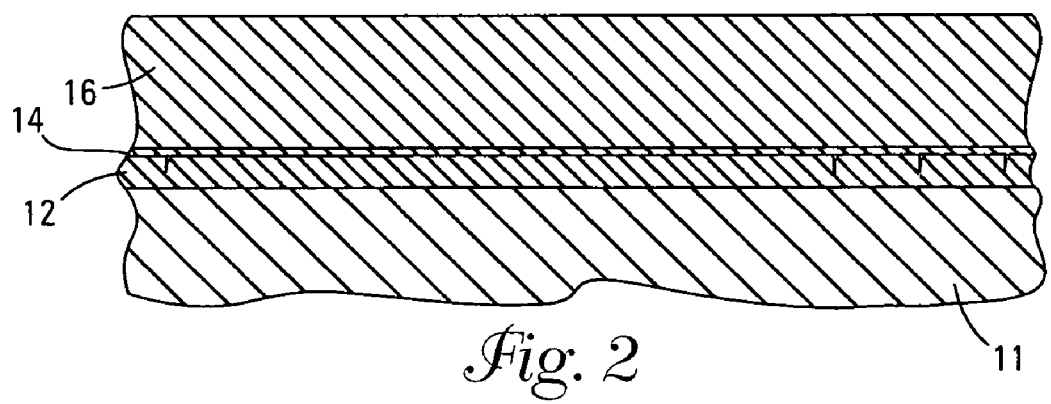
FIGS. 2-6 are cross-sectional views of a portion of a memory device during various stages of fabrication in accordance with an embodiment of the invention.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms substrate or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a substrate or substrate in the following description, previous process steps may have been utilized to form regions/junctions in the base semiconductor structure, and terms substrate or substrate include the underlying layers containing such regions/junctions. The following detailed description is, therefore, not to be taken in a limiting sense, and the scope of the present invention is defined only by the appended claims and equivalents thereof.

FIG. 1 illustrates a memory cell or field effect transistor 10 having a stepped gate dielectric constructed and arranged according to the principles of the present invention. The field effect transistor 10 is formed on a substrate or semiconductor substrate 11 that is in one embodiment fashioned of a monocrystalline silicon material, though other materials may be used. The transistor 10 includes left and right charge trapping dielectrics 12a, 12b, a stepped gate dielectric 28, and a gate conductor or control gate 30. The left and right charge trapping dielectrics 12a, 12b are typically associated with a source 34 and a drain 36, respectively, though it is to be understood that the association of the source 34 and drain 36 with the charge trapping dielectrics 12a, 12b may be reversed where required.

FIGS. 2-6 illustrate one embodiment of a method of fabricating a transistor 10. In a first step illustrated in FIG. 2, a charge trapping dielectric layer 12 is deposited on the substrate 11. The charge trapping dielectric layer 12 is preferably a composite structure that includes two or more dielectric materials laid down upon the substrate 11. In one embodiment of the transistor 10, the charge trapping dielectric layer 12 is formed of a first component layer of silicon dioxide and a second component layer of silicon nitride. The first component layer of silicon dioxide may be formed on the substrate 11 using, for example, a wet or dry oxidation process, an atomic layer deposition (ALD) process, or a chemical vapor deposition (CVD) process. The second component layer of silicon nitride may be deposited onto the previously grown silicon dioxide layer using, for example, a chemical vapor deposition technique to form the charge trapping dielectric layer 12. Additional or alternative component layers may be added as required. Other materials that may be laid down as part of the charge trapping dielectric layer 12 either in lieu of, or in addition to, the materials described hereinabove may include, but are not limited to, $Al_2O_3$, $HfO_2$, HfON, HfOSiN, $Ta_2O_5$, or combinations thereof. In general, dielectric layer 12 includes one or more layers of material that individually or in combination have the ability to store and release an electric charge.

Once the charge trapping dielectric layer 12 has been formed, an etch stop layer 14 will preferably be deposited onto the charge trapping dielectric layer 12. Note that the etch stop layer 14 is itself optional in that careful selection of subsequent etching processes may obviate the need for a distinct etch stop layer 14. In some instances, however, if it is found that the etch stop layer 14 is beneficial to the operation of the transistor 10, this layer, or some portion thereof, may remain part of the structure of the transistor 10. Examples of some suitable materials that may form the etch stop layer 14 include, but are not limited to, titanium nitride and $Al_2O_3$. A sacrificial layer 16, preferably of silicon nitride, is applied over the etch stop layer 14 to act as a hard mask. To the extent that the etch stop layer 14 is later removed, the total thickness of the sacrificial layer 16 and any remaining portion of the etch stop layer 14, taken together, can define the height of the control gate 30.

Figure 3:
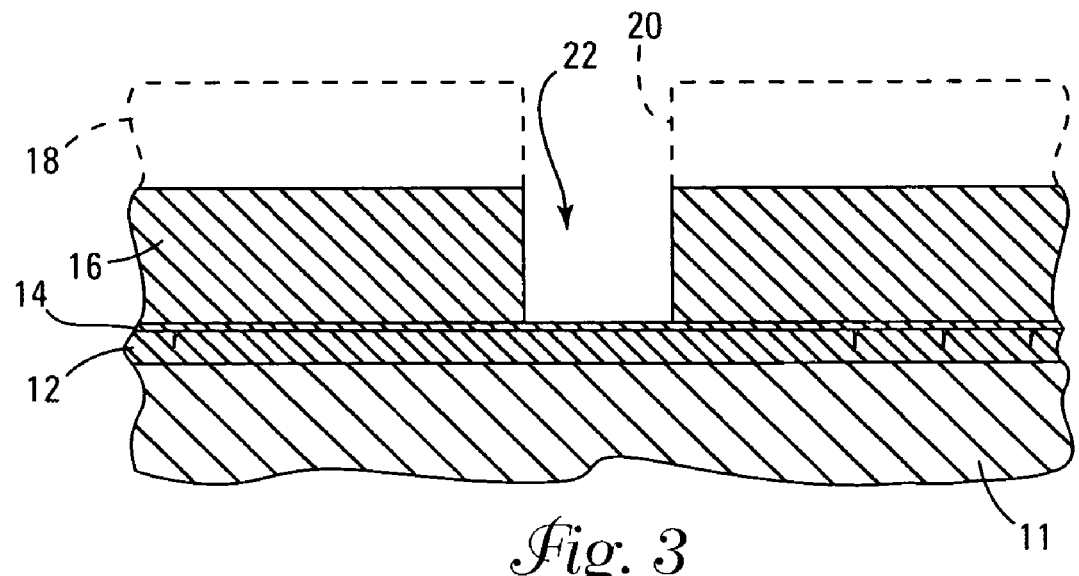

FIG. 3 illustrates the formation of a groove or gap 22 in the sacrificial layer 16. By way of example, the groove 22 may be formed by applying a photoresist layer 18 over the sacrificial layer 16 and then exposing the photoresist layer 18 to ultraviolet light in a preselected pattern. The photoresist layer 18 is subsequently developed to remove those portions of the photoresist layer 18 that remain undeveloped, thereby resulting in a gap 20 in the layer 18. The width of the gap 20 generally defines the width of the control gate 30. The groove 22 is then etched into and through the sacrificial layer 16, and depending on the requirements of the application, into and/or through the etch stop layer 14 as well. In some instances, a portion of the etch stop layer 14 will remain after this etching step, and in other instances, the etching procedure will remove the entire etch stop layer 14. It is preferred to utilize a plasma or ion-etching process for creating the groove 22, though other directional etching methods or processes may be used as well. Once the groove 22 has been etched into the sacrificial layer 16 and etch stop layer 14, the remaining photoresist layer 18 is removed such as by using a chemical wet stripping process, a plasma stripping process, or other suitable means.

Figure 4:
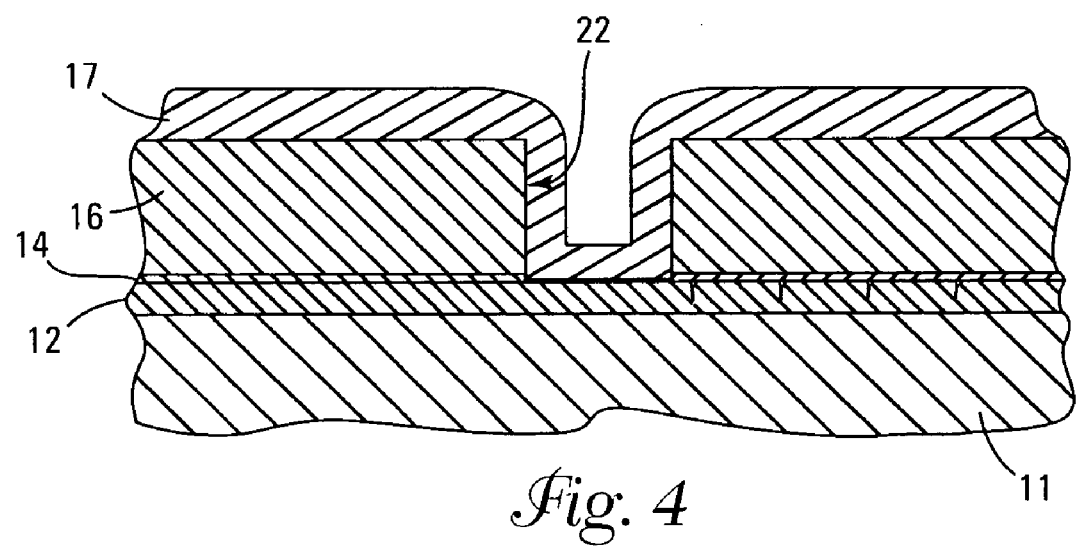

After the remaining photoresist layer 18 has been removed, a layer of silicon dioxide or another suitable sacrificial material such as, for example TEOS oxide, is deposited over the sacrificial layer 16 to form spacers 24. As one example, a spacer layer 17 could be blanket deposited over layers 12, 14, and 16 as shown in FIG. 4. This spacer layer 17 may then be anisotropically removed to leave spacers 24 as shown in FIG. 5.

Figure 5:
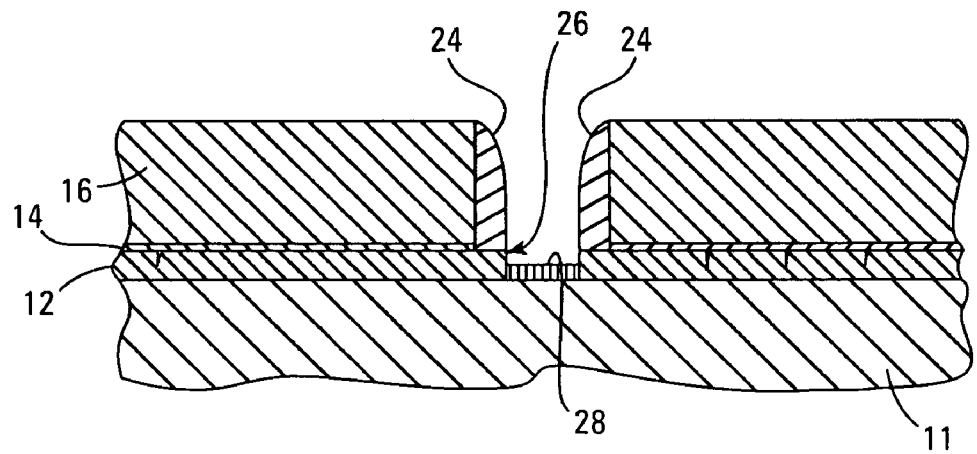

Following the formation of the spacers 24, an ion, plasma, or other directional removal process may then be employed to form a groove 26 through the charge trapping layer 12 as shown in FIG. 5. A gate dielectric 28 is then formed in the groove 26 on substrate 11. Suitable gate dielectrics 28 may be composite structures having multiple layers of distinct materials, or may be fashioned of a single monolithic layer of a single material. Materials from which the gate dielectric 28 may be fashioned include, but are not limited to, high-K materials, metal oxides, or silicates. Some examples of these materials include silicon dioxide, $SiO_xN_y$, $Ta_2O_5$, $TiO_2$, $Y_2O_3$, $CeO_2$, $SrTiO_3$, $Al_2O_3$, $La_2O_3$, and silicates of hafnium and zirconium. The gate dielectric 28 may be deposited upon the substrate 11 in groove 26 using any one of a number of suitable processes including, but not limited to, physical vapor deposition (PVD), molecular beam epitaxy (MBE), sputtering, chemical solution deposition, chemical vapor deposition (CVD), thermal oxidation, and atomic layer deposition (ALD). Note that one or more adhesion or barrier layers may be formed over the gate dielectric layer and/or the charge trapping layers.

Figure 6:
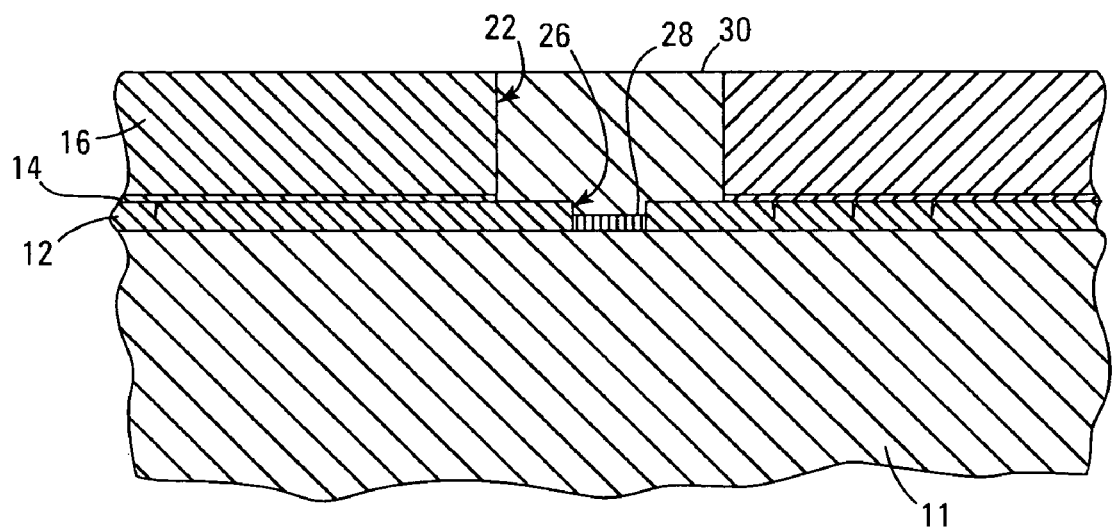

Once the gate dielectric 28 is formed and the spacers 24 removed, a gate conductor 30 is formed in the groove 22 as shown in FIG. 6. The gate conductor 30 may be formed of any suitable conductor that is compatible with the materials used in the construction of the field effect transistor 10 and the processes used in its manufacture. In one embodiment, polysilicon is used to form the gate conductor 30. Note that polysilicon used to form the gate conductor 30 may be doped during or after the formation of the gate conductor 30. Other materials that may be used, either by themselves, or as part of a multilayered or composite gate conductor structure include, but are not limited to suitable metals, metal silicides, conductive metal oxides, conductive metal nitrides, and the like. Some specific examples of suitable gate conductor materials include, Nb, Ir, Os, Ru and its oxide, Ta, TaN, TiN, Mo, W, Ni, and Pt. After deposition of the gate conductor 30, by, for example, PVD or another suitable process, the top surface of the gate conductor 30 may be planarized back. The sacrificial layer 16 is then removed using a suitable stripping process such as a chemical wet stripping process, a plasma stripping process, or the like.

As described above, one or more intervening layers may be formed over the gate dielectric 28 and/or the charge trapping layers 12. Such intervening layers may or may not, depending on the application, remain in place after the gate conductor 30 is formed overlying the gate dielectric 28 and/or charge trapping layers 12. These intervening layers may include adhesion layers or barrier layers that provide or promote compatibility between device layers, protect against the migration of reactive materials, improve reliability of the device, etc.

Once the sacrificial layer 16 has been removed, a final removal step may be undertaken to trim the charge trapping layers 12a and 12b and any remaining portions of the etch stop layer 14, if present, flush with the sides of the gate conductor 30. This etching step is preferably carried out using a suitable directional dry etching process. Where appropriate, the gate conductor 30 may itself be used as the mask for this etching step, or a photoresist layer (not shown) may be applied and developed to provide a suitable mask for the etch. Once the structure of the field effect transistor 10 has been completed, source 34 and drain 36 may be formed by doping the substrate 11 with a suitable dopant such as boron, for a p-type transistor, or phosphorus or arsenic, for an n-type transistor.

Figure 7:
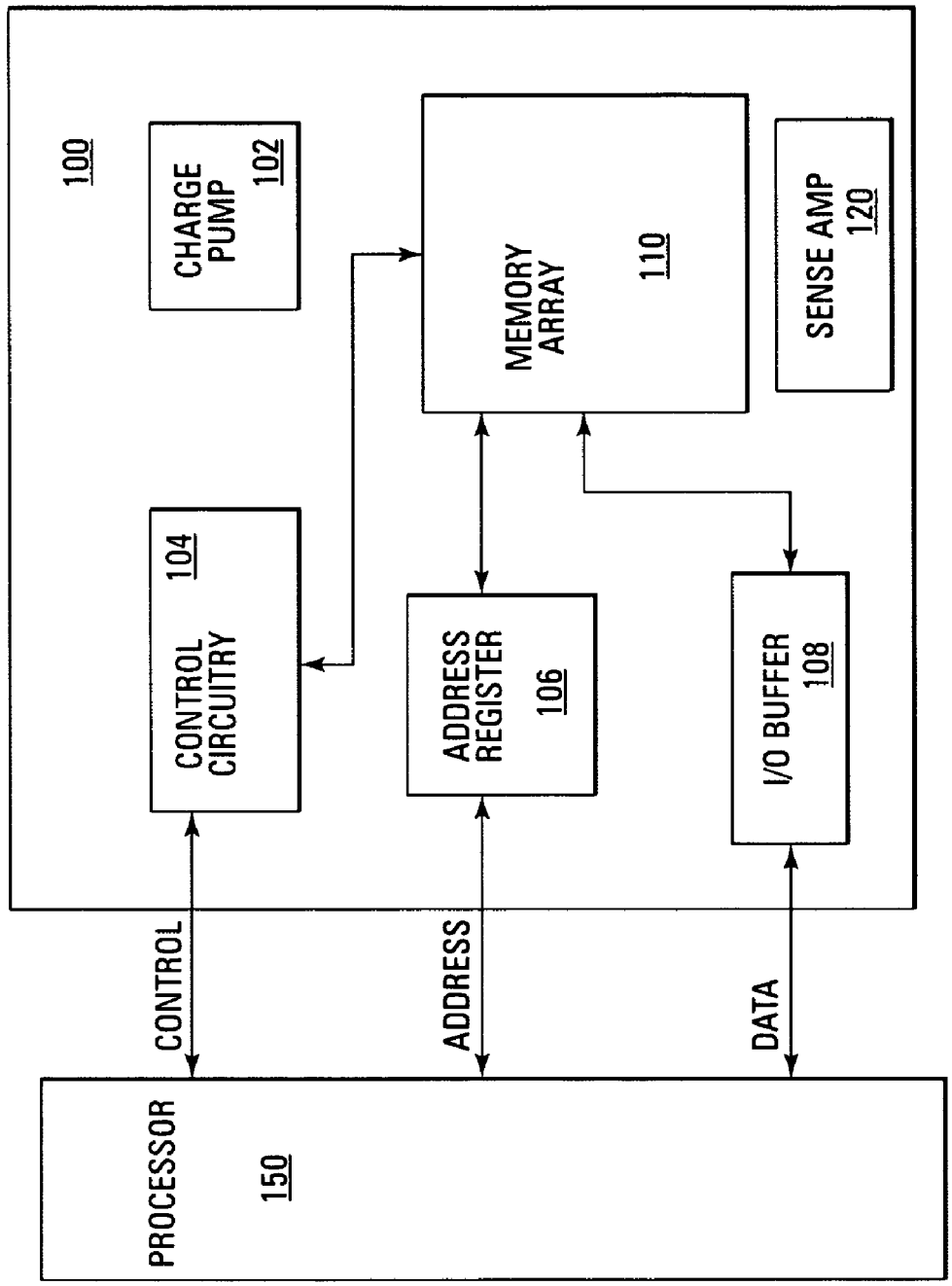
FIG. 7 is a simplified block diagram of an integrated memory device, according to an embodiment of the present invention.

FIG. 7 is a simplified block diagram of a memory device 100 that incorporates a memory cell/field effect transistor 10 according to the present invention. Memory device 100 includes charge pump circuitry 102 to provide voltages of a predetermined level, such as a programming voltage (Vpp), to memory cells within a memory array 110 during memory operations. Control circuitry 104 is provided to control access to the memory array 110. An address register 106 is used to receive address requests to memory array 110. In addition, an input/output (I/O) buffer 108 is used to smooth out the flow of data to and from the memory array 110. Sense amplifier and compare circuitry 120 is used to sense data stored in the memory cells and verify the accuracy of stored data.

FIG. 7 also illustrates an exterior processor 150, or memory controller, electrically coupled to memory device 100 for memory accessing as part of an electronic system. Processor 150 is coupled to the control circuitry 104 to supply control commands. Processor 150 is also coupled to the address register to supply address requests. Moreover, processor 150 is coupled to the I/O buffer 108 to send and receive data.

Figure 8:
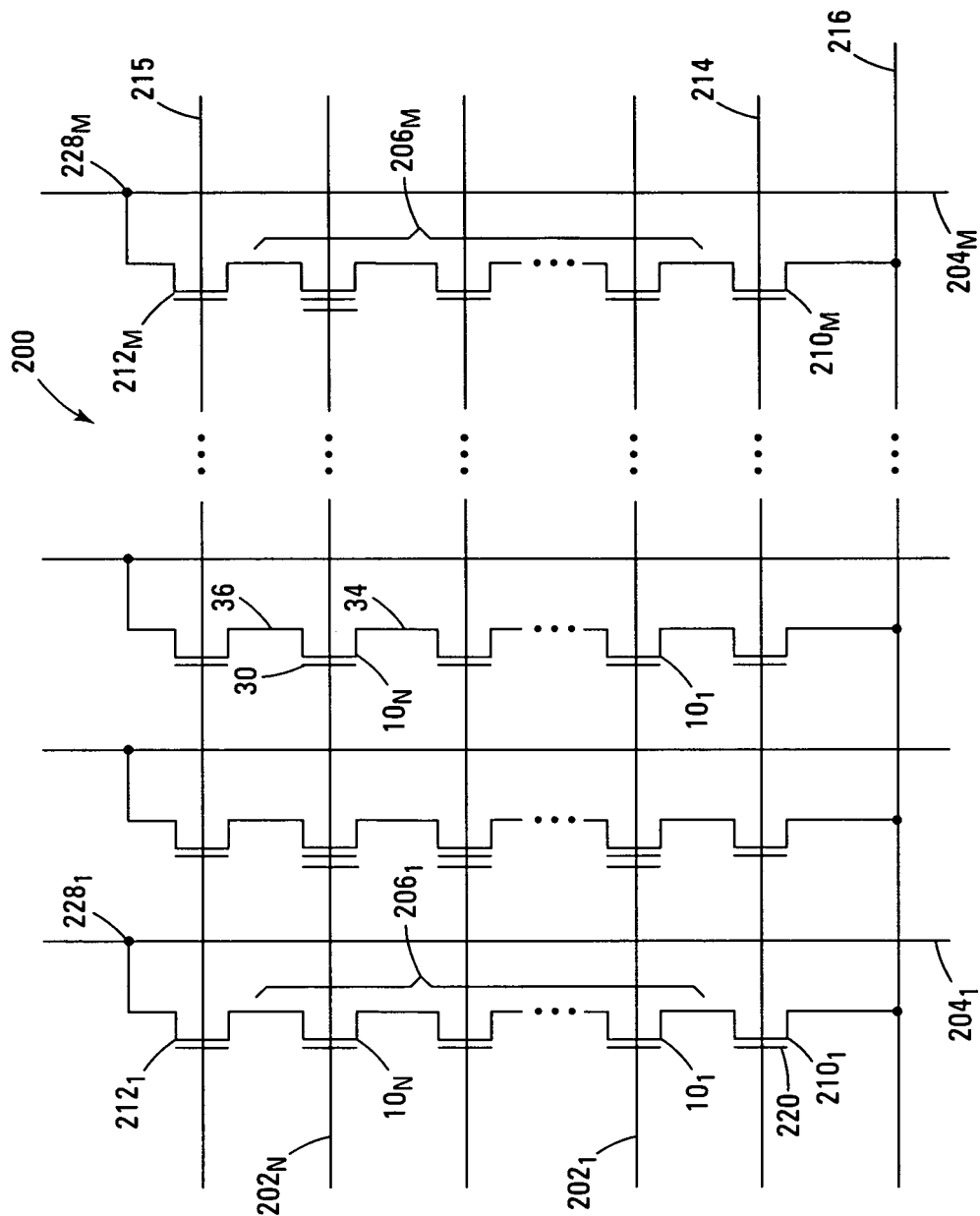
FIG. 8 is a simplified block diagram of a NAND memory array incorporating an embodiment of the present invention; and, FIG. 9 is a simplified block diagram of a NOR memory array incorporating an embodiment of the present invention.

Non-volatile memory cells in accordance with the invention are suitable for use in a variety of memory array types. One example is a NAND memory array. FIG. 8 is a schematic of a NAND memory array 200 as a portion of memory array 110 in accordance with another embodiment of the invention. As shown in FIG. 8, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes field effect transistors $10_1$ to $10_N$, each located at an intersection of a word line 202 and a local bit line 204. The field effect transistors 10 represent non-volatile memory cells for storage of data. The field effect transistors 10 of each NAND string 206 are connected in series source to drain between a source select gate 210 and a drain select gate 212. The source and drain select gates 210, 212 may be field effect transistors constructed according to an embodiment of the present invention or may be another suitable device. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first field effect transistor 10 of the corresponding NAND string 206. For example, the drain of source select gate $210_1$ is connected to the source of field effect transistor $10_1$ of the corresponding NAND string $206_1$. A control gate 220 of each source select gate 210 is connected to source select line 214.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last field effect transistor 10 of the corresponding NAND string 206. For example, the source of drain select gate $212_1$ is connected to the drain of field effect transistor $10_N$ of the corresponding NAND string $206_1$.

As described above in conjunction with FIGS. 1-6, the field effect transistors 10 include a source 34 and a drain 36, and a control gate 30, as shown in FIG. 1. Field effect transistors 10 have their control gates 30 coupled to a word line 202. A column of the field effect transistors 10 are those NAND strings 206 coupled to a given local bit line 204. A row of the field effect transistors 10 are those transistors commonly coupled to a given word line 202.

Figure 9:
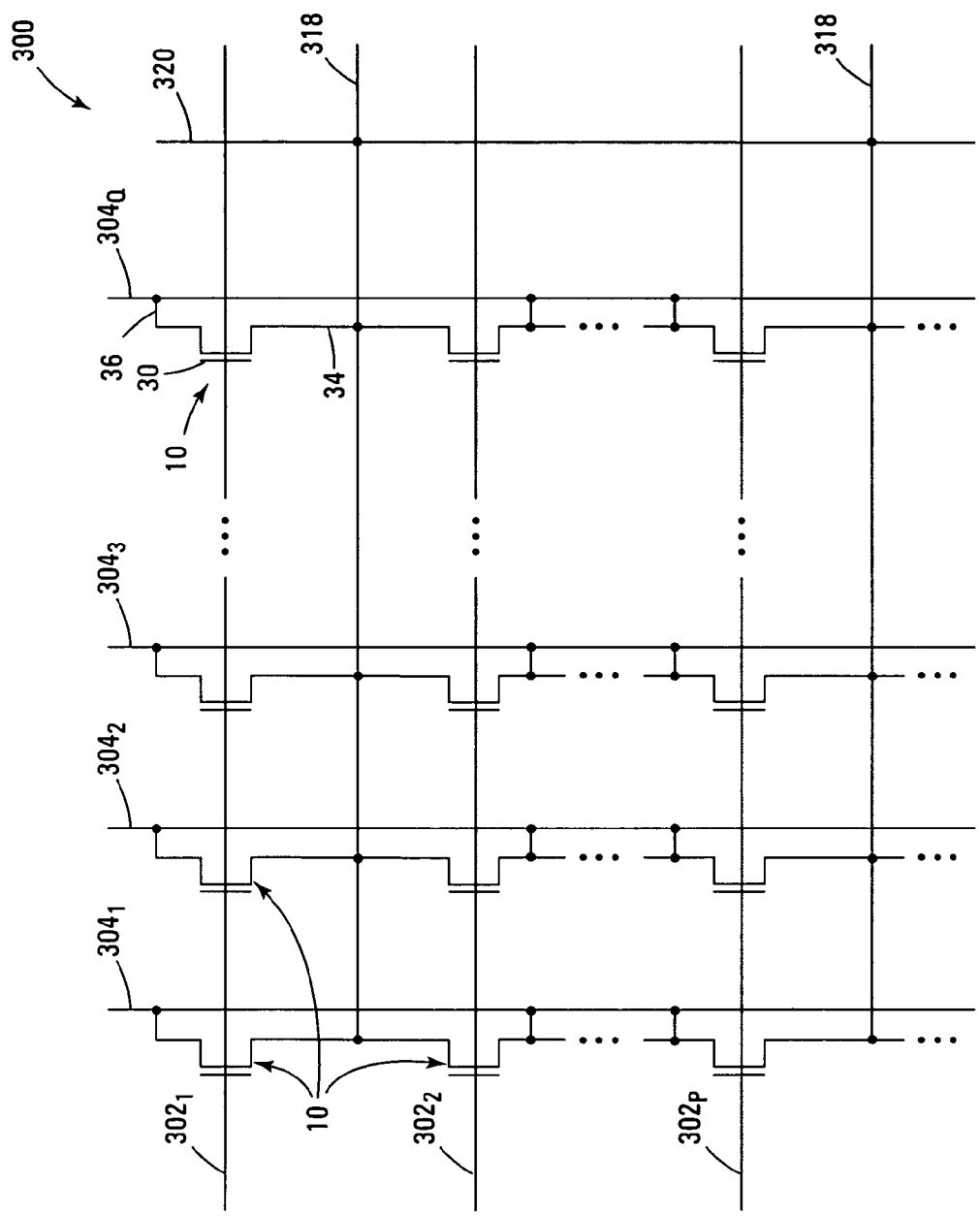

Another example of an array type suitable for use with memory cells in accordance with the invention is a NOR memory array. FIG. 9 is a schematic of a NOR memory array 300 as a portion of memory array 110 of FIG. 7 in accordance with another embodiment of the invention. Memory array 300 includes word lines $302_1$ to $302_P$ and intersecting local bit lines $304_1$ to $304_Q$. For ease of addressing in the digital environment, the number of word lines 302 and the number of bit lines 304 are each some power of two, e.g., 256 word lines 302 by 4,096 bit lines 304. The local bit lines 304 are coupled to global bit lines (not shown) in a many-to-one relationship.

Field effect transistors 10 are in this embodiment located at each intersection of a word line 302 and a local bit line 304. The field effect transistors 10 represent non-volatile memory cells for storage of data. As described above, typical construction of such field effect transistors 10 includes a source 34 and a drain 36, and a control gate 30.

Field effect transistors 10 having their control gates 30 coupled to a word line 302 typically share a common source depicted as array source 318. As shown in FIG. 9, field effect transistors 10 coupled to two adjacent word lines 302 may share the same array source 318. Field effect transistors 10 have their drains 36 coupled to a local bit line 304. A column of the field effect transistors 10 includes those transistors commonly coupled to a given local bit line 304. A row of the field effect transistors 10 includes those transistors commonly coupled to a given word line 302.

To reduce problems associated with high resistance levels in the array source 318, the array source 318 is regularly coupled to a metal or other highly conductive line to provide a low-resistance path to ground. The array ground 320 serves as this low-resistance path.

It is to be noted that the memory cells of memory arrays 200, 300 may be programmed to correspond to single bit or multi-bit operation. Programming and sensing of charge-trapping memory cells is well understood in the art and will not be detailed herein.

CONCLUSION

The formation of memory cells having a stepped gate have been described herein to facilitate increases in charge trapping capacity generally independent of gating characteristics. Although specific embodiments have been illustrated and described herein it is manifestly intended that this invention be limited only by the following claims and equivalents thereof.

What is claimed is:

1. A method of forming a memory cell, comprising:

forming a first dielectric layer overlying a semiconductor substrate;

forming and patterning a hard mask layer overlying the first dielectric layer, thereby exposing a first portion of the first dielectric layer bounded by sidewalls of the hard mask layer;

forming spacers on the sidewalls of the hard mask layer, leaving a central portion of the first portion of the first dielectric layer exposed between the spacers;

removing the central portion of the first portion of the first dielectric layer, thereby exposing a portion of the substrate;

forming a second dielectric layer on the exposed portion of the substrate;

removing the spacers from the sidewalls of the hard mask layer;

forming a control gate layer overlying the first and second dielectric layers;

removing the hard mask layer; and, forming source and drain regions in the substrate on opposing sides of the control gate layer.

2. The method of claim 1, wherein the method is performed in the order presented.

3. The method of claim 1, wherein forming the first dielectric layer further comprises:

forming a first layer of dielectric material overlying and adjoining the substrate; and forming a second layer of dielectric material overlying and adjoining the first layer of dielectric material.

4. The method of claim 3, wherein the first layer of dielectric material is of silicon dioxide and the second layer of dielectric material is of silicon nitride.

5. The method of claim 1, wherein forming spacers on the sidewalls of the hard mask layer, leaving a central portion of the first portion of the first dielectric layer exposed between the spacers comprises:

forming a layer of spacer material over the hard mask layer and the exposed first portion of the first dielectric layer; and removing a portion of the layer of spacer material to expose the central portion of the first portion of the first dielectric layer.

6. The method of claim 5, wherein removing a portion of the layer of spacer material comprises anisotropically removing the portion of the layer of spacer material.

7. The method of claim 5, wherein the spacer material is TEOS oxide.

8. The method of claim 1, wherein the hard mask layer is of silicon nitride.

9. The method of claim 1 further comprises forming an etch stop layer over the first dielectric layer.

10. The method of claim 9, wherein the etch stop layer is substantially removed while removing the central portion of the first portion of the first dielectric layer.

11. The method of claim 9, wherein at least a portion of the etch stop layer remains after the removal of the central portion of the first portion of the first dielectric layer.

12. The method of claim 1, wherein the second dielectric layer comprises high-K materials, metal oxides, or silicates.

13. The method of claim 1 further comprises forming at least one of an adhesion layer or a barrier layer over the first and second dielectric layers before forming the control gate layer.

14. The method of claim 1, wherein forming a control gate layer comprises doping the control gate layer during or after the formation thereof.

15. The method of claim 1 further comprises removing a remainder of the first dielectric layer that extends beyond lateral edges of the control gate layer before forming the source and drain regions.

16. A method of forming a memory cell, comprising:

forming a first dielectric layer overlying a semiconductor substrate;

forming and patterning a hard mask layer overlying the first dielectric layer, thereby exposing a first portion of the first dielectric layer bounded by sidewalls of the hard mask layer;

forming a sacrificial layer over the hard mask layer and the exposed first portion of the first dielectric layer;

forming spacers on the sidewalls of the hard mask layer by anisotropically removing a portion of the first sacrificial layer and leaving a central portion of the first portion of the first dielectric layer exposed between the spacers;

removing the central portion of the first portion of the first dielectric layer, thereby exposing a portion of the substrate;

forming a second dielectric layer on the exposed portion of the substrate;

removing the spacers from the sidewalls of the hard mask layer;

forming a control gate layer overlying the first and second dielectric layers; removing the hard mask layer;

removing a remainder of the first dielectric layer that extends beyond lateral edges of the control gate layer; and forming source and drain regions in the substrate on opposing sides of the control gate layer.

17. The method of claim 16 further comprises forming an etch stop layer over the first dielectric layer.

18. The method of claim 17, wherein the etch stop layer is substantially removed while removing the central portion of the first portion of the first dielectric layer.

19. The method of claim 17, wherein at least a portion of the etch stop layer remains after the removal of the central portion of the first portion of the first dielectric layer.

20. The method of claim 16 further comprises forming an adhesion layer or a barrier layer over the first and second dielectric layers before forming the control gate layer.

* * * * *